United States Patent
Goodnow et al.

(10) Patent No.: US 7,739,637 B2
(45) Date of Patent: Jun. 15, 2010

(54) PARTIAL GOOD SCHEMA FOR INTEGRATED CIRCUITS HAVING PARALLEL EXECUTION UNITS

(75) Inventors: Kenneth Joseph Goodnow, Essex Junction, VT (US); Michael Richard Ouellette, Westford, VT (US); Stephen Gerard Shuma, Underhill, VT (US); Peter Albert Twombly, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/362,541

(22) Filed: Jan. 30, 2009

(65) Prior Publication Data
US 2009/0144673 A1    Jun. 4, 2009

Related U.S. Application Data

(63) Continuation-in-part of application No. 11/848,278, filed on Aug. 31, 2007, now Pat. No. 7,716,615.

(51) Int. Cl.
    *G06F 17/50* (2006.01)
(52) U.S. Cl. .................................. 716/5; 716/1
(58) Field of Classification Search ............. 716/1, 716/5
    See application file for complete search history.

(56) References Cited

U.S. PATENT DOCUMENTS

| | | | |
|---|---|---|---|
| 4,970,724 A | 11/1990 | Yung | |
| 5,638,290 A | 6/1997 | Ginetti et al. | |
| 5,655,069 A | 8/1997 | Ogawara et al. | |
| 5,872,717 A | 2/1999 | Yu et al. | |
| 5,953,745 A | 9/1999 | Lattimore et al. | |
| 6,166,559 A | 12/2000 | McClintock et al. | |
| 6,201,744 B1 | 3/2001 | Takahashi | |
| 6,347,378 B1 | 2/2002 | MacArthur et al. | |
| 6,385,071 B1 | 5/2002 | Chai et al. | |
| 6,550,020 B1 | 4/2003 | Floyd et al. | |
| 6,714,902 B1 | 3/2004 | Chao et al. | |
| 6,732,229 B1 | 5/2004 | Leung et al. | |
| 6,788,541 B1 | 9/2004 | Hsiung | |
| 7,042,243 B2 * | 5/2006 | Matsumoto | 324/763 |
| 7,093,216 B2 | 8/2006 | Nozuyama et al. | |
| 7,117,417 B2 | 10/2006 | Sharpe et al. | |
| 7,205,785 B1 | 4/2007 | Carlson | |
| 7,251,746 B2 | 7/2007 | Fox et al. | |
| 7,305,600 B2 | 12/2007 | Farnsworth et al. | |
| 7,434,129 B2 | 10/2008 | Farnsworth et al. | |

(Continued)

OTHER PUBLICATIONS

U.S. Appl. No. 11/848,278, "Office Action", Jul. 16, 2009, 10 pages.

(Continued)

*Primary Examiner*—Jack Chiang
*Assistant Examiner*—Suchin Parihar
(74) *Attorney, Agent, or Firm*—W. Riyon Harding; Hoffman Warnick LLC

(57) ABSTRACT

Processing engines (PE's) disposed on the substrate. Each processing engine includes a measurement and storage unit, and a PE controller coupled to each of the processing engines. The processing engines perform self-tests and store the results of the self-tests in the measurement and storage unit. The PE controller reads the results and selects a sub-set of processing engines based on the results and an optimization algorithm.

20 Claims, 3 Drawing Sheets

U.S. PATENT DOCUMENTS

2004/0230928 A1   11/2004   Nozuyama et al.
2006/0187001 A1   8/2006    Pessolano et al.
2007/0006117 A1   1/2007    Chang et al.
2007/0260823 A1*  11/2007   Dickinson et al. ........... 711/153
2008/0174331 A1*  7/2008    Yuan-Chi et al. ............ 324/765
2008/0177527 A1*  7/2008    Yoshinaga ................... 703/26
2008/0282102 A1*  11/2008   Reddy et al. ................. 713/323
2009/0106569 A1*  4/2009    Roh et al. .................... 713/300

OTHER PUBLICATIONS

U.S. Appl. No. 11/848,278, Notice of Allowance & Fees Due, Dec. 15, 2009, 12 pages.

* cited by examiner

PARTIAL GOOD SCHEMA FOR INTEGRATED CIRCUITS HAVING PARALLEL EXECUTION UNITS

CROSS-REFERENCE TO RELATED APPLICATIONS

The present application is a continuation in part of U.S. application Ser. No. 11/848,278, filed on Aug. 31, 2007 now U.S. Pat. No. 7,716,615, titled, "REDUNDANT CRITICAL PATH CIRCUITS TO MEET PERFORMANCE REQUIREMENT" and is herein incorporated by reference in its entirety, and assigned to the assignee of the present application.

FIELD OF THE INVENTION

This invention relates to design structures for integrated circuits and, in particular, to design structure for configurable integrated circuits having parallel execution units contained thereon.

DESCRIPTION OF THE RELATED ART

As semiconductor lithography sizes shrink, variability across a particular wafer is becoming a much greater factor. At small geometries, the absolute error of factors such as length, width and oxide thickness become a larger percentage of the target values. As such, minor variations across a wafer may lead to degraded or unacceptable performance of certain integrated circuits (ICs).

Another problem that results from the decreased lithography size is related to frequency. As lithography moves from 90 nm to 65 nm to 45 nm, nominal switching frequencies are increasing. However, the worst case switching frequency is not increasing at the same rate. In some instances, worst case frequency may actually be decreasing. In particular, the decreased lithography is allowing IC density to increase according to Moore's law (density doubling approximately every two years). Power and frequency, however, are not increasing at such a rate. One reason power and frequency are not increasing at the same rate as density is due to variations across a wafer.

Power consumption is also becoming an increasing concern as lithography size decreases. Indeed, leakage power is quickly becoming as great a factor as active power. Furthermore, across a particular wafer, power consumption variations are becoming more disparate. In particular, variations in threshold voltage (Vt) for transistors across the wafer lead to leakage power differences across the wafer. Further, capacitance variations may lead to active power differences across the wafer.

As density increases and frequency gains decelerate, designers are turning to redundancy and parallelism to get more work done in a given IC or system. Currently, there exists the capability to create IC's with approximately 1000 parallel processing engines (PE's). Of course, as technology improves, the number of PE's on an IC may increase. These parallel PE's divide the work amongst themselves to take advantage of parallel processing. However, the PE's are themselves subject to the variations described above and one PE does not necessarily perform the same as the next.

SUMMARY

One embodiment of the present invention is directed to a design structure tangibly embodied in machine readable medium for designing, manufacturing, or testing an integrated circuit. The design structure of this embodiment includes a substrate and a plurality of processing engines (PE's) disposed on the substrate, each processing engine including a measurement and storage unit. This embodiment also includes a PE controller coupled to each of the plurality of processing engines, wherein the PE controller is configured to cause the measurement and storage unit on each processing engine to perform self-tests and to store the results of the self-tests. The PE controller is further configured to receive the results and select a sub-plurality of the plurality of processing engines based on the results and an optimization algorithm. The design structure further includes a programmable voltage regulator coupled to the PE controller configured to produce a supply voltage and a clock controller coupled to the PE controller and each of the sub-plurality of processing engines.

Another embodiment of the present invention is directed to a hardware description language (HDL) design structure encoded on a machine readable data storage medium, the HDL design structure comprising elements that when processed in a computer-aided design system generates a machine-executable of an integrated circuit. The HDL design structure of this embodiment includes a substrate and a plurality of processing engines (PE's) disposed on the substrate, each processing engine including a measurement and storage unit. This embodiment also includes a PE controller coupled to each of the plurality of processing engines, wherein the PE controller is configured to cause the measurement and storage unit on each processing engine to perform self-tests and to store the results of the self-tests. The PE controller is further configured to receive the results and select a sub-plurality of the plurality of processing engines based on the results and an optimization algorithm. The design structure further includes a programmable voltage regulator coupled to the PE controller configured to produce a supply voltage and a clock controller coupled to the PE controller and each of the sub-plurality of processing engines.

Another embodiment of the present invention is directed to a method of operating an integrated circuit including a plurality of processing engines (PE's) and a PE controller. The method of this embodiment includes signaling at least a portion of the PE's to perform one or more tests; storing the results of the tests; executing an algorithm to determine a sub-plurality of PEs to operate based on the results; deselecting PE's that are not in the sub-plurality; and setting the clock frequency and the supply voltage for the integrated circuit.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Embodiments of the present invention are directed to architectures and implementations to optimize system performance on an IC having parallel or redundant PE's. The optimizations may include, but are not limited to, maximizing overall system performance, minimizing power to achieve a given execution capability, and finding an optimized power consumption to performance for a particular IC. These optimizations may be achieved either at a manufacturing test time, at power up or dynamically depending upon the implementation.

In one embodiment, the optimizations are achieved by interrogating each PE on multi-PE IC having a plurality of PE's located thereon to determine their particular operating characteristics. Examples of the operating characteristics may include, but are not limited to, maximum execution frequency versus voltage, power consumption versus voltage, a minimum operating voltage ($V_{min}$), and maximum communication frequency versus voltage. Based on the requirements for a particular IC, a sub-set of the plurality of PE that give the IC the best solution to the particular optimization are selected and the non-selected processors are switched out. Based on the operating characteristics of the selected PE's, the system clock to the PE's, bus interconnect speeds, chip voltages and the like may be set.

Figure 1:
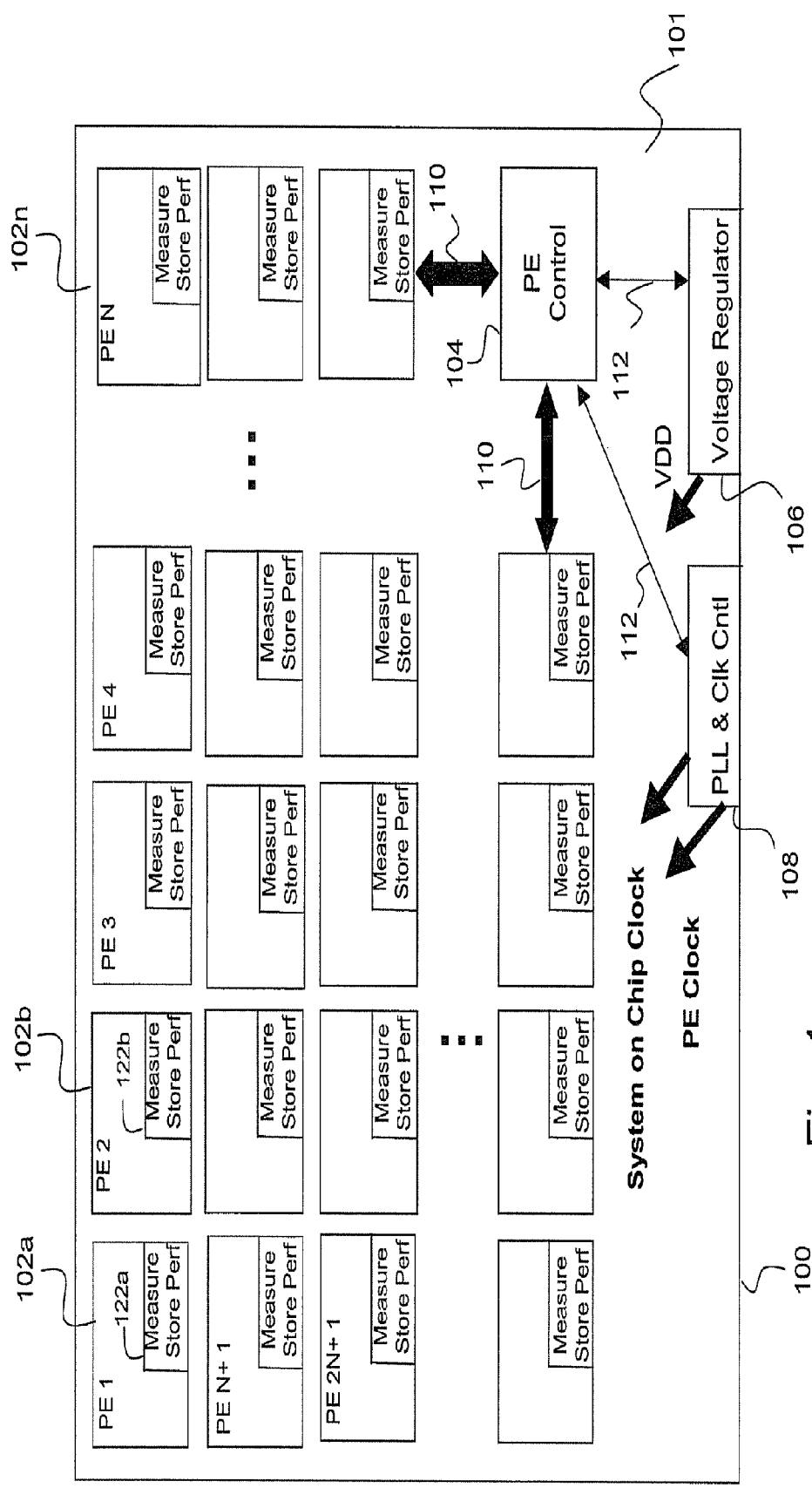
FIG. 1 shows an example embodiment of a multi-PE integrated circuit according to one embodiment of the present invention.

FIG. 1 shows an example of a multi-PE IC 100 according to an embodiment of the present invention. The IC 100 may be formed on a silicon substrate 101. The IC 100 may include a plurality of PE's 102a, 102b, ... 102n, a PE controller 104, a voltage regulator 106 and a clock controller 108. The PE controller 104 may be coupled to the PE's via a PE control communication bus 110. The PE controller 104 may be coupled to the voltage regulator 106 and the clock controller 108 via a system control bus 112. As shown, the PE controller 104 is resident on the IC 100. In some embodiments, the PE controller 104 may be located external to the IC 100. In such embodiments, the PE controller 104 may be permanently or temporarily coupled to the PE control communication bus 110 and the system control bus 112. In one embodiment, the PE controller 104 may be part of an external testing device. Regardless of its location, the PE controller 104 may be implemented as a microprocessor such as PowerPC (PPC) or as an advanced risk machine (ARM) or any other type or microprocessor, or as a finite state machine (FSM).

In one embodiment, the clock controller 108 may provide one or more clock signals. For instance, the clock controller 108 may provide a clock signal that is provided each PE 102. The clock controller 108 may also provide a signal (which may be the same as the clock signal) to the system on a chip (SOC) bus (not shown). The clock signal(s) serves to set the operating speeds of the PE's 102 and any communication busses on the IC. In operation, the PE controller 104 sets the clock rate of the clock(s) provided by the clock controller 108.

The voltage regulator 106 is also controlled by the PE controller 104. The voltage regulator provides a system voltage to the entire IC 100. Of course, the voltage provided by the voltage regulator 106 may be stepped up or down by other circuits (not shown) on the IC.

In one embodiment, some or all of the PE's 102 may include a measurement and storage unit 122. For example, PE 102a may include measurement and storage unit 122a and PE 102n may include measurement and storage unit 122n. The measurement and storage units 122 are configured to cause the PE on which it is resident to perform self-tests and to store the results of the tests. As discussed above, the tests may include, but are not limited to, maximum frequency versus voltage, power consumption versus voltage, $V_{min}$, etc. These particular tests may be important due to the characteristics of PE's that are produced using small lithography techniques. For instance, it has been discovered that the operating speed of PE's may increase as the voltage increases.

In operation, the PE control 104 initiates measurement and storage of the attributes of each PE via the PE control communication bus 110. The measurement and storage may be performed on startup, at manufacturing test, or dynamically. The tests to be performed may be stored in the measurement and storage units 122. One or more tests are performed and the results are stored in the measurement and storage units. As shown, the measurement and storage units 122 are formed as part of a PE. Of course, the measurement and storage units 122 could be formed outside of a PE and, in some instances, may be formed off of the IC 100. For example, the measurement and storage units could be part of a testing unit (not shown) located off of the IC 100.

Regardless of how the test data is gathered or where it is stored, the test data for each PE is transmitted to the PE controller 104. The PE controller 104 received the data and, based on the data, selects the particular PE's that allow the IC 100 to function under particular constraints or operating conditions.

One example of a particular optimization may be to maximize total system performance. In such an optimization, the goal is to define a frequency where each processor can run and select the frequency and voltage that will give the highest overall execution capability. For example, assume 10,000 PE's are on the IC 100 and 9,990 of them can operate at over 100 million instructions per second (MIPs) and 10 of them can only operate up to 90 MIPs. In such a case, the 90 MIPS operating speed is the fastest the IC 100 may operate. As such, the maximum number of MIPs if all PE's are selected is 900,000 (10,000×90 MIPs) while if only the 9,990 PE's that may operate at 100 MIPs are used, the maximum number of MIPs is 999,000 (9,990×100 MIPs). Another example of particular optimization is to minimize total system power needed to attain a given execution capability (i.e., a total required number of MIPs). In such an optimization, the frequency, voltage, and set of processors that give lowest power, while attaining that execution capability, are selected. Such an optimization may take into account $V_{min}$, power vs. frequency, and power vs. voltage. In another example of a particular optimization, the best power/performance ratio of a given IC 100 may be found. Each of the above optimizations may be made utilizing well known optimization techniques.

Regardless of which particular optimization is performed, after the optimization has been completed, the non-selected PE's are switched out. Depending on the implementation, the PE's may be permanently switched out utilizing, for example, electronic fuse (e-fuse) or any other fusing mechanism, or temporarily switched out by, for example, setting registers (not shown) that select or deselect particular PE's 102. The clock controller 108 is set to one or more particular rates, bus/interconnects speeds are set and the voltage regulator 106 is set to particular voltage by signals received from the PE controller 104.

As discussed above, the optimizations may be made at manufacturing test time, at start up, or dynamically. If the test is to be done a manufacturing time, the measurements are received by the PE controller 104 (which may be on or off of the IC 100), the optimization made and the PE's 102 selected. In such a case, the selection may include utilizing e-fuses to permanently disable the non-selected PE's. In another embodiment, the testing and optimization may be done each time the IC 100 is started up. In such a case, it may be preferable not to use e-fuses. Such a choice is completely up to the IC designer but, as one of skill in the art will realize, the operating characteristics of particular PE's 102 may change over time and usage. As such, the particular PE's that are selected may change over time. In another embodiment, the testing and optimization may be done dynamically. Such an embodiment may, advantageously, allow the IC 100 to be configured and PE's selected based on the particular real time operating environment in which the IC 100 is currently operating. For instance, if the IC 100 is part of a cellular phone, it may be advantageous to operate in a reduced power configuration when the phone is on stand-by and switch to a different mode when the call is being conducted. Each of these modes may have different operating requirements and the ability to dynamically alter the operating characteristics of the IC 100 may allow the IC to match these changing requirements more closely.

Figure 2:
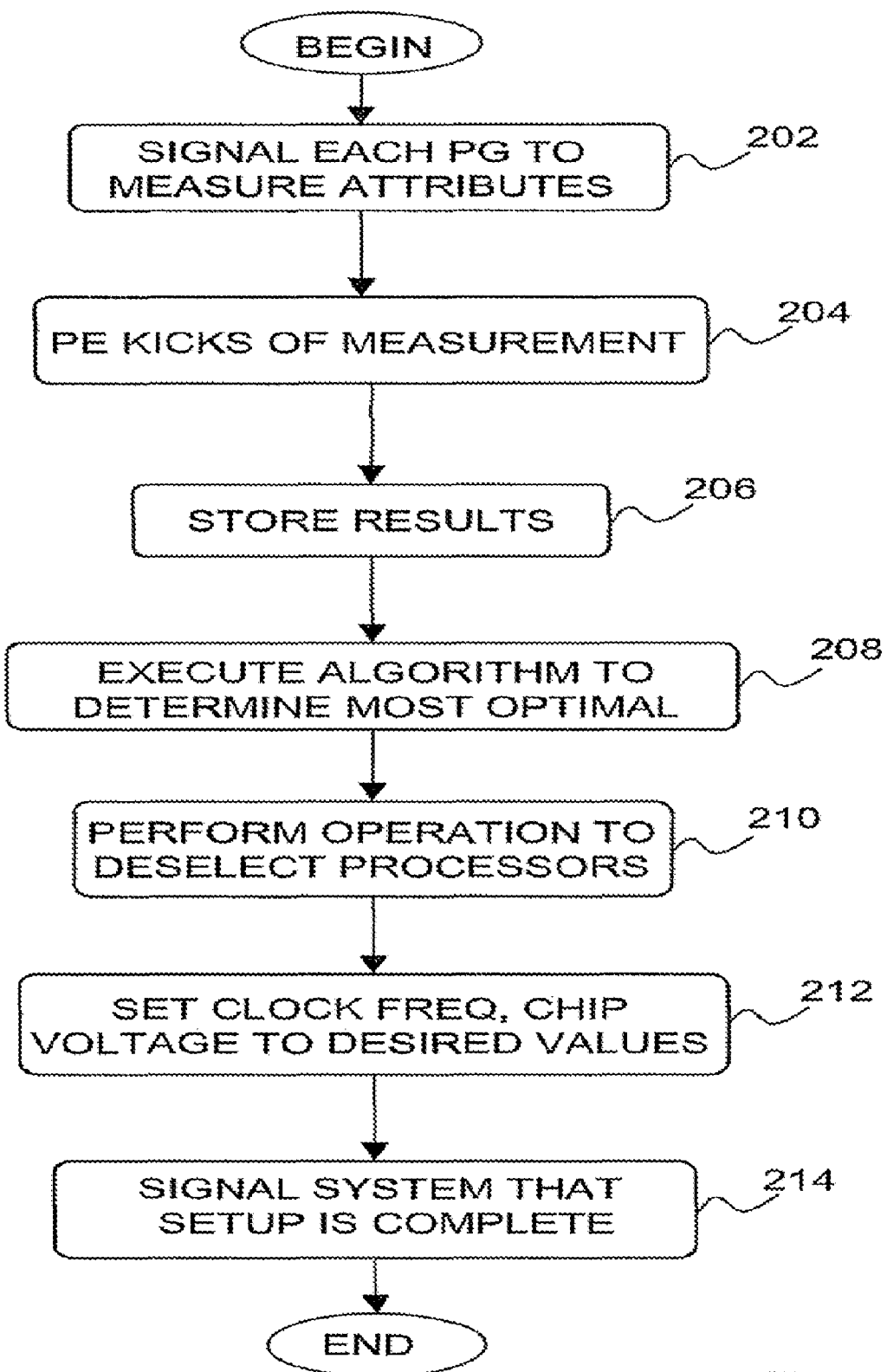
FIG. 2 is a flow-chart showing one embodiment of a method according to the present invention.

FIG. 2 shows a flow diagram of a method according to one embodiment of the present invention. The method includes a block 202 where one or more of the PE's on a multi-PE IC are signaled to begin measuring operating characteristics. As discussed above, the signaling may be done at manufacturing test time, at start up, or dynamically. In some embodiments, the signaling may be done at a combination of one or more of manufacturing test time, at start up, and dynamically.

At a block 204, the signaled PE's begin to perform the particular performance measurements. As discussed above, these measurements may include, but are not limited to, maximum frequency versus voltage, power consumption versus voltage, and $V_{min}$. The results of the measurements are stored at a block 206. In some embodiments, the results of the measurements may be stored on the measurement and storage unit of each tested PE. Of course, the results could be stored in other locations such as, for example, the PE controller.

At a block 208, one or more optimization algorithms are performed on the results of the performance measurements to determine which of the PE's to switch in or out. This determination may also include determining the clock frequency and chip voltage to be applied to the PE's. At a block 210 the unselected processors are deselected. As discussed above several methods, including blowing e-fuses or setting particular registers may be utilized to deselect particular PE's.

At a block 212 the clock frequency and chip voltages are set. The clock frequency and chip voltage, as discussed above, may be determined when the PE's are selected, for example, at block 208. In one embodiment, the method may also include signaling a system control unit indicating that the multi-PE is ready for operation.

Figure 3:
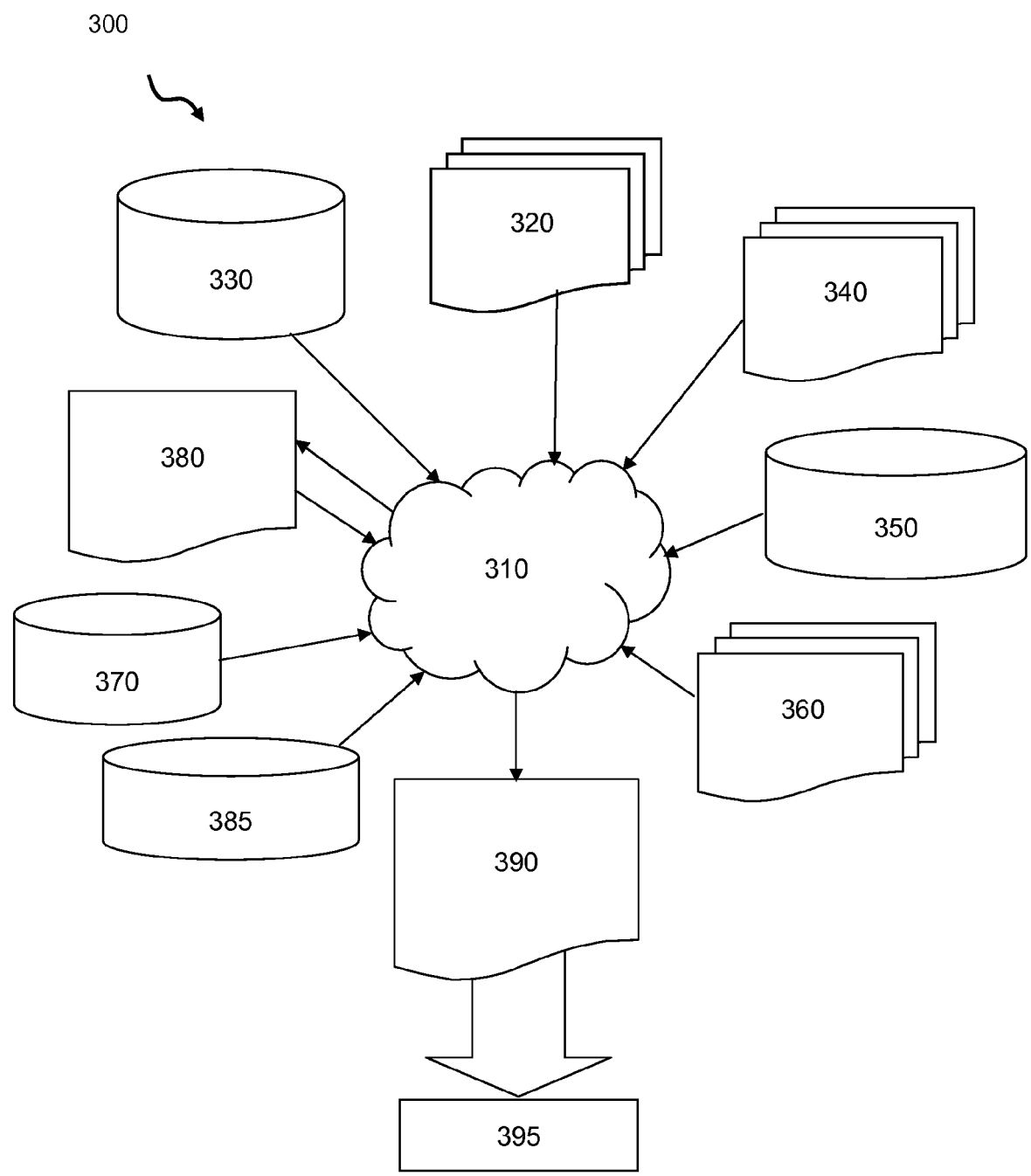
FIG. 3 is a flow diagram of a design process used in semiconductor design, manufacture, and/or test.

FIG. 3 shows a block diagram of an exemplary design flow 300 used for example, in semiconductor IC logic design, simulation, test, layout, and manufacture. Design flow 300 includes processes and mechanisms for processing design structures or devices to generate logically or otherwise functionally equivalent representations of the design structures and/or devices described above and shown in FIG. 1. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, or system such as those shown in FIG. 1. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or logic structures shown in FIG. 1 to generate a netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 390 may comprise a compiled, executable HDL simulation model that functionally simulates the devices shown in FIG. 1.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 390 may then proceed to a stage 395 where, for example, design structure 390: proceeds to tape-out, is released to manufacturing, is released to a mask house, is sent to another design house, is sent back to the customer, etc.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A design structure in a data format tangibly embodied in machine readable medium for designing, manufacturing, or testing an integrated circuit, the design structure comprising:
   a substrate;
   a plurality of processing engines (PE's) disposed on the substrate, each processing engine including a measurement and storage unit for performing a self-test of the processing engine and storing results of the self-test;
   a PE controller coupled to each of the plurality of processing engines, wherein the PE controller is configured to cause the measurement and storage unit of each processing engine to perform self-tests and to store the results of the self-tests, wherein the PE controller is further configured to receive the results of the self-tests for each of the processing engines and select a sub-plurality of the plurality of processing engines based on the results and an optimization algorithm;
   a programmable voltage regulator coupled to the PE controller configured to produce a supply voltage; and
   a clock controller coupled to the PE controller and each of the sub-plurality of processing engines.

2. The design structure of claim 1, wherein the PE controller is disposed on the substrate.

3. The design structure of claim 1, further comprising:
   a system control communication bus coupling the PE controller to the voltage regulator and the clock controller.

4. The design structure of claim 3, wherein the PE controller is further configured to determine a supply voltage value and a clock signal speed based on the results and to provide the supply voltage value to the voltage regulator via the system control communication bus and to provide the clock signal speed to the clock controller via the system control communication bus.

5. The design structure of claim 1, wherein the optimization algorithm determines the highest overall execution capability of the integrated circuit.

6. The design structure of claim 5, wherein the optimization algorithm further determines a clock speed and an operating voltage.

7. The design structure of claim 1, wherein the optimization algorithm determines the minimal power consumption needed to attain an execution capability.

8. The design structure of claim 1, wherein the optimization algorithm determines a best power to performance ratio.

9. The design structure of claim 1, wherein the design structure is a netlist.

10. The design structure of claim 1, wherein the design structure resides on a storage medium as a data format used for the exchange of layout data of integrated circuits.

11. A method of operating an integrated circuit including a plurality of processing engines (PE's) and a PE controller, the method comprising:
    signaling, by the PE controller, at least a portion of the PE's to perform one or more self-tests using a measurement and storage unit included in each PE;
    storing, on the measurement and storage unit of the PE, the results of the self-tests performed by the measurement and storage unit included in each PE;
    executing an algorithm to determine a sub-plurality of PE's to operate based on the results;
    deselecting, by the PE controller, PE's that are not in the sub-plurality; and
    setting the clock frequency and the supply voltage for the integrated circuit.

12. The method of claim 11, wherein signaling is performed at a predetermined time.

13. The method of claim 12, wherein the predetermined time is at start up of the integrated circuit.

14. The method of claim 12, wherein the predetermined time occurs when the integrated circuit transitions from one operating mode to another operating mode.

15. The method of claim 12, wherein the predetermined time is at a manufacturing test time.

16. The method of claim 11, wherein deselecting includes blowing a fuse.

17. The method of claim 11, wherein deselecting includes setting a register.

18. The method of claim 11, wherein executing the algorithm includes determining the highest overall execution capability of the integrated circuit.

19. The method of claim 18, wherein executing the algorithm includes determining a clock speed and an operating voltage.

20. The method of claim 11, wherein executing the algorithm includes determining the minimal power consumption needed to attain an execution capability.

* * * * *